( 12 ) United States Patent
Romesburg et al.

(10) Patent No.: US 7,729,673 B2
(45) Date of Patent: Jun. 1, 2010

(54) METHOD AND APPARATUS FOR MULTICHANNEL SIGNAL LIMITING

(75) Inventors: Eric Douglas Romesburg, Chapel Hill, NC (US); Stefan Gustavsson, Helsingborg (SE)

(73) Assignee: Sony Ericsson Mobile Communications AB, Lund (SE)

( * ) Notice: Subject to any disclaimer, the term of this patent is extended or adjusted under 35 U.S.C. 154(b) by 1147 days.

(21) Appl. No.: 11/071,683

(22) Filed: Mar. 3, 2005

(65) Prior Publication Data

US 2006/0148435 A1 Jul. 6, 2006

Related U.S. Application Data

(60) Provisional application No. 60/640,607, filed on Dec. 30, 2004.

(51) Int. Cl.
 *H04B 1/26* (2006.01)
(52) U.S. Cl. .............. 455/199.1; 455/177.1; 455/200.1; 455/232.1
(58) Field of Classification Search .............. 455/199.1, 455/242.2, 242.1, 198.1, 63.1, 66.1, 67.11–67.13, 455/174.1, 177.1, 194.1, 194.2, 200.1, 212, 455/219–222, 225, 241.1, 251.1, 232.1; 381/107, 381/63, 80, 104, 119, 106
See application file for complete search history.

(56) References Cited

U.S. PATENT DOCUMENTS

| 5,212,733 | A | 5/1993 | Devitt et al. | |
|---|---|---|---|---|
| 6,332,026 | B1 | 12/2001 | Kuusama et al. | |
| 6,535,846 | B1 | 3/2003 | Shashoua | |
| 6,760,452 | B2 * | 7/2004 | Lau et al. | 381/106 |
| 6,839,441 | B1 * | 1/2005 | Powers et al. | 381/119 |
| 7,177,432 | B2 * | 2/2007 | Eid et al. | 381/22 |
| 7,206,413 | B2 * | 4/2007 | Eid et al. | 381/22 |
| 2003/0055635 | A1 | 3/2003 | Bizjak | |
| 2003/0055636 | A1 * | 3/2003 | Katuo et al. | 704/225 |
| 2004/0037440 | A1 * | 2/2004 | Croft, III | 381/119 |
| 2004/0081324 | A1 * | 4/2004 | Lau et al. | 381/106 |
| 2004/0207466 | A1 * | 10/2004 | Anderson et al. | 330/10 |
| 2004/0213420 | A1 * | 10/2004 | Gundry et al. | 381/104 |
| 2005/0160126 | A1 * | 7/2005 | Bruhn et al. | 708/322 |
| 2005/0281418 | A1 * | 12/2005 | Shashoua | 381/119 |
| 2006/0018486 | A1 * | 1/2006 | Neoran et al. | 381/63 |
| 2007/0005160 | A1 * | 1/2007 | Zaucha et al. | 700/94 |
| 2007/0211908 | A1 * | 9/2007 | Van Reck | 381/80 |
| 2008/0025530 | A1 * | 1/2008 | Romesburg | 381/107 |

* cited by examiner

OTHER PUBLICATIONS

PCT International Search Report, International Application No. PCT/US2005/030210, Jan. 30, 2006.

*Primary Examiner*—Pablo N Tran
(74) *Attorney, Agent, or Firm*—Coats & Bennett, P.L.L.C.

(57) ABSTRACT

A method and apparatus provide multichannel signal limiting to prevent any channel signal within a multichannel signal from exceeding defined limits, while still preserving the gain and/or amplitude relationships among the individual channel signals. A limiter is configured to calculate a limiting factor as the value needed to prevent a limit violation on the worst-case one of the channel signals, and then commonly apply that limiting factor to the gain control of all channel signals. Thus, the limiter may generate an actual gain value for each channel signal as the product of that channel signal's desired gain value and the current value of the limiting factor. Notably, in multichannel audio signal applications, coordinating gain control across the individual audio channels by use of the commonly applied limiting factor prevents undesirable spatial shifting of the soundstage, e.g., shifting of the stereo image.

24 Claims, 4 Drawing Sheets

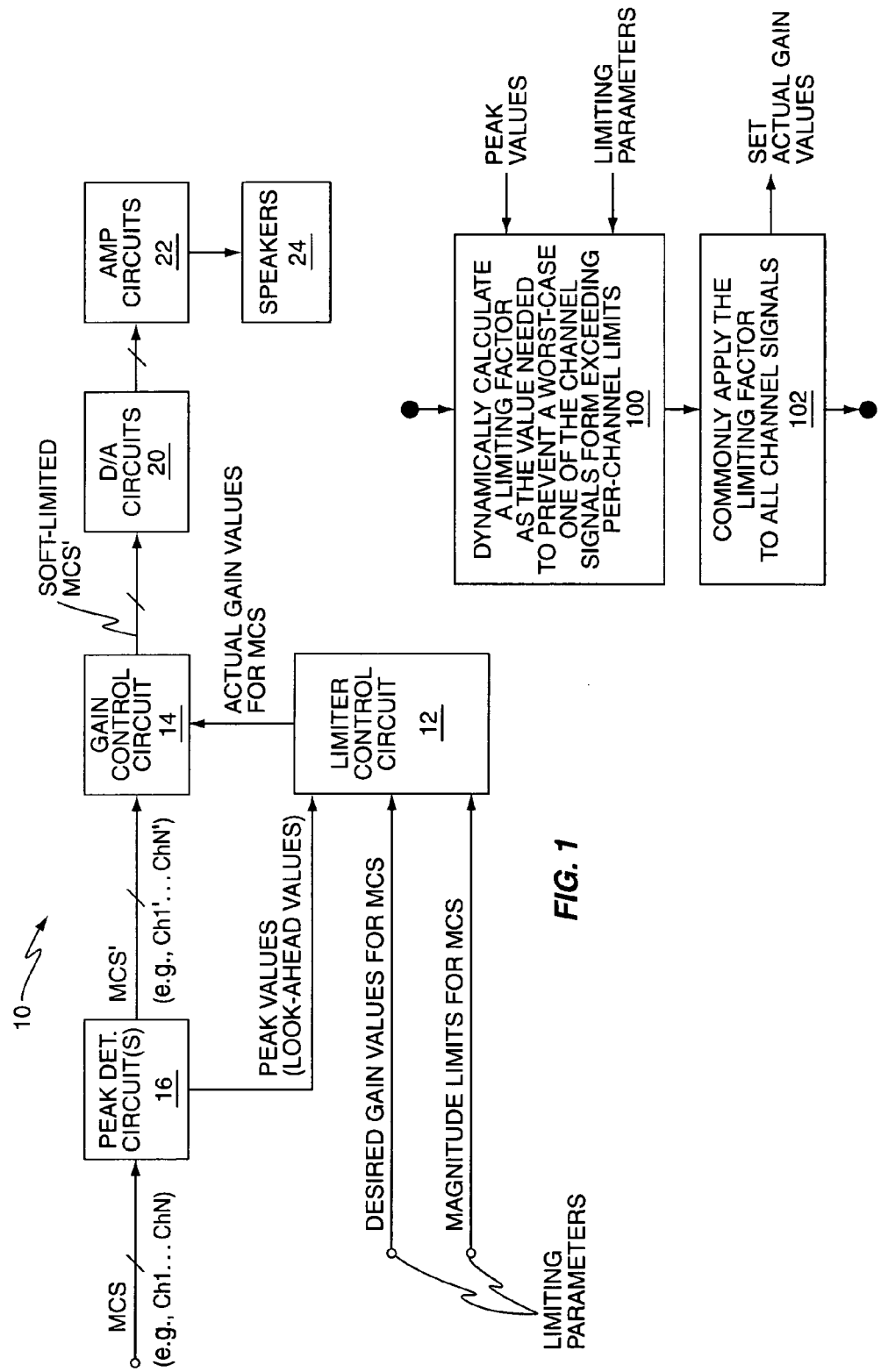

METHOD AND APPARATUS FOR MULTICHANNEL SIGNAL LIMITING

RELATED APPLICATIONS

This application claims priority under 35 U.S.C. §119(e) from the U.S. provisional application Ser. No. 60/640,607 filed on 30 Dec. 2004 and entitled "Method and Apparatus for Multichannel Signal Limiting." That provisional application is incorporated in its entirety herein by reference.

BACKGROUND OF THE INVENTION

The present invention generally relates to signal limiters used to prevent clipping or saturation, or to control the characteristics of a signal around some maximum amplitude, and particularly relates to multichannel limiters.

Signal limiting represents a common safeguarding function that is employed in a wide variety of applications, in the analog, digital and acoustic domains. Signal limiting in its simplest form comprises limiting a given signal's amplitude at some maximum permissible value. Hard limiting, for example, imposes a hard limit on the peak signal amplitude permitted, with the hard limit typically set at the value needed to prevent over-driving one or more circuits in the signal path into saturation. Hard limiting may occur inherently, such as when the value of a signal exceeds the full-scale measurement range available for measuring the signal.

In any case, hard limiting typically "clips" a given waveform at the limit, which changes the waveform shape, forfeits signal information, and introduces signal non-linearity. Soft limiting represents a more sophisticated approach to limiting. Soft limiting preserves the shape of the signal, while still limiting its peak amplitude. In other words, soft limiting preserves the linearity of the signal by fractionally scaling it—i.e., attenuating the signal by some gain factor less than unity—rather than simply capping its peak values. Not surprisingly, then, soft limiting represents the preferred approach in applications where the non-linearity that would be introduced by hard limiting is objectionable. Audio signal limiting is one such application.

For example, soft limiting can be used on a stereo signal to prevent either channel signal from exceeding some defined magnitude limit. Soft limiting in audio applications prevents undesirable non-linearity in the audio signal, which would result in audible distortions. The magnitude limits may be defined by one or more digital or analog circuit elements in the audio signal path, or by the loudspeakers being used to generate the audible output, for example.

Regardless of the underlying reason for imposing magnitude limits, the application of limiting control to a multichannel signal can be problematic. For example, only a subset of the channel signals comprising a multichannel audio signal may require limiting at any given time, or different ones of the channel signals may require differing amounts of soft limiting to prevent clipping. In either case, the conventional approach to limiting control applies to each channel whatever soft scaling value is needed to prevent that channel signal's amplitude from exceeding the limits defined for that channel.

In other words, different limiting values potentially are applied to different ones of the channel signals comprising the multichannel signal, meaning that the relative amplitude relationships that existed among the channel signals before limiting is altered by the limiting operation. With multichannel audio signals, altering the relative amplitudes among the channel signals causes unintended and oftentimes undesirable effects. For example, the stereo or multichannel "image" being produced by the loudspeakers may noticeably shift around as a function of limiting control. Other types of deleterious effects may arise in other multichannel signal limiting applications.

SUMMARY OF THE INVENTION

The present invention comprises a method and apparatus to limit a multichannel signal, which may have different limiter parameters for different ones of the channel signals comprising the multichannel signal, by applying the same limiting factor to all such channel signals. For example, two or more channels may have different maximum magnitude limits set for them and/or may have different desired gain values set for them. Regardless of such parameter differences among the channels, the limiting factor is set to the value needed to prevent clipping on a worst-case one of the channels, i.e., the channel signal that would violate its magnitude limits by the greatest amount absent limiting.

For multichannel audio signals, one or more limiter embodiments calculate a limiting factor in the presence of differing per-channel limiter parameters, and commonly applying the same limiting factor to all channels signals comprising the multichannel signal. Doing so prevents clipping on any of the channel signals, despite any differences in limiter parameters that might exist among the channels, while preserving the amplitude relationships among the channel signals by uniformly imposing on all channel signals the gain reduction needed to prevent clipping on the worst-case channel signal. Preserving the amplitude relationships among the channel signals prevents, in the case of multichannel audio signals, undesirable spatial shifts in the sound imaging. Thus, limiting may be applied, for example, to a stereo signal where the left and right channels have differing magnitude limits and/or differing desired channel gains, without undesirable shifting in the stereo image.

More broadly, in one or more embodiments, a method of limiting multichannel signals comprises dynamically setting a limiting factor to a value needed to prevent any channel signal of the multichannel signal from exceeding a maximum magnitude limit defined for the channel signal, and commonly applying the limiting factor to all channel signals. "Applying" the limiting factor to all of the channel signals may comprise, for example, scaling the desired gain value of each channel signal by the limiting factor, such that the actual gain for each channel signal is the product of that channel signal's current desired gain setting and the limiting factor.

By calculating the limiting factor based on the worst-case channel signal, the limiting factor can be set for no limiting, e.g., set to unity, if none of the channel signals requires limiting. Indeed, in one or more embodiments, a look-ahead peak detector provides peak values for each channel signal, which can be multiplied by the desired gain value of each channel to form a product term. Limiting ratios can then be generated for each channel signal by dividing the maximum magnitude limit set for each channel signal by that channel signal's corresponding product term. The limiting factor can then be set to the lowest one of the limiting ratios if any of them are less than unity, or otherwise set to unity.

In one or more embodiments, a limiter is configured to implement the above method of soft limiting a multichannel signal and comprises one or more processing circuits configured to dynamically calculate a limiting factor as the value needed to prevent a worst-case one of the channel signals from exceeding per-channel limits, and commonly applies the limiting factor to all of the channel signals. The limiter can be implemented in hardware, software, or any combination thereof. For example, a Digital Signal Processor (DSP), Application Specific Integrated Circuit (ASIC), Field Programmable Gate Array (FPGA), microprocessor/microcontroller, or other type of processing circuit can be configured to execute program instructions implementing the above described method of multichannel limiting, or to implement variations of that method. Of course, in one or more other embodiments, the limiter may comprise dedicated hardware circuits, and it should be understood that the limiter can be configured to operate in the digital domain, the analog domain, or any combination thereof.

In at least one embodiment, the limiter comprises a limiter control circuit configured to calculate the limiting factor by evaluating limiter parameters for each channel signal, and a scaling circuit for each channel signal. Each scaling circuit is configured to scale a corresponding one of the channel signals by scaling a desired gain value for the channel signal by the limiting factor, and applying the scaled desired gain value to the channel signal. Thus, the actual gain for each channel signal is a product of that channel's desired gain value and the current value of the limiting factor.

The limiter further comprises, or is associated with, one or more "look-ahead" peak detectors that provide per-channel peak detection, wherein the peak values provided to the limiter control circuit for the channel signals are advanced in time. Such time advancing of the peak detection function can be accomplished by delaying the channel signals before inputting them into the scaling circuits used for limiting control.

Of course, the present invention is not limited to the above features and advantages. Those skilled in the art will recognize additional features and advantages of the present invention upon reading the following detailed description, and upon viewing the accompanying figures.

BRIEF DESCRIPTION OF THE DRAWINGS

FIG. 1 is a block diagram of a limiter circuit configured to provide limiting control for a multichannel signal.

FIG. 2 is a logic flow diagram of processing logic for one or more embodiments of the limiting control method carried out by the limiter of FIG. 1.

DETAILED DESCRIPTION OF THE INVENTION

Figure 3:
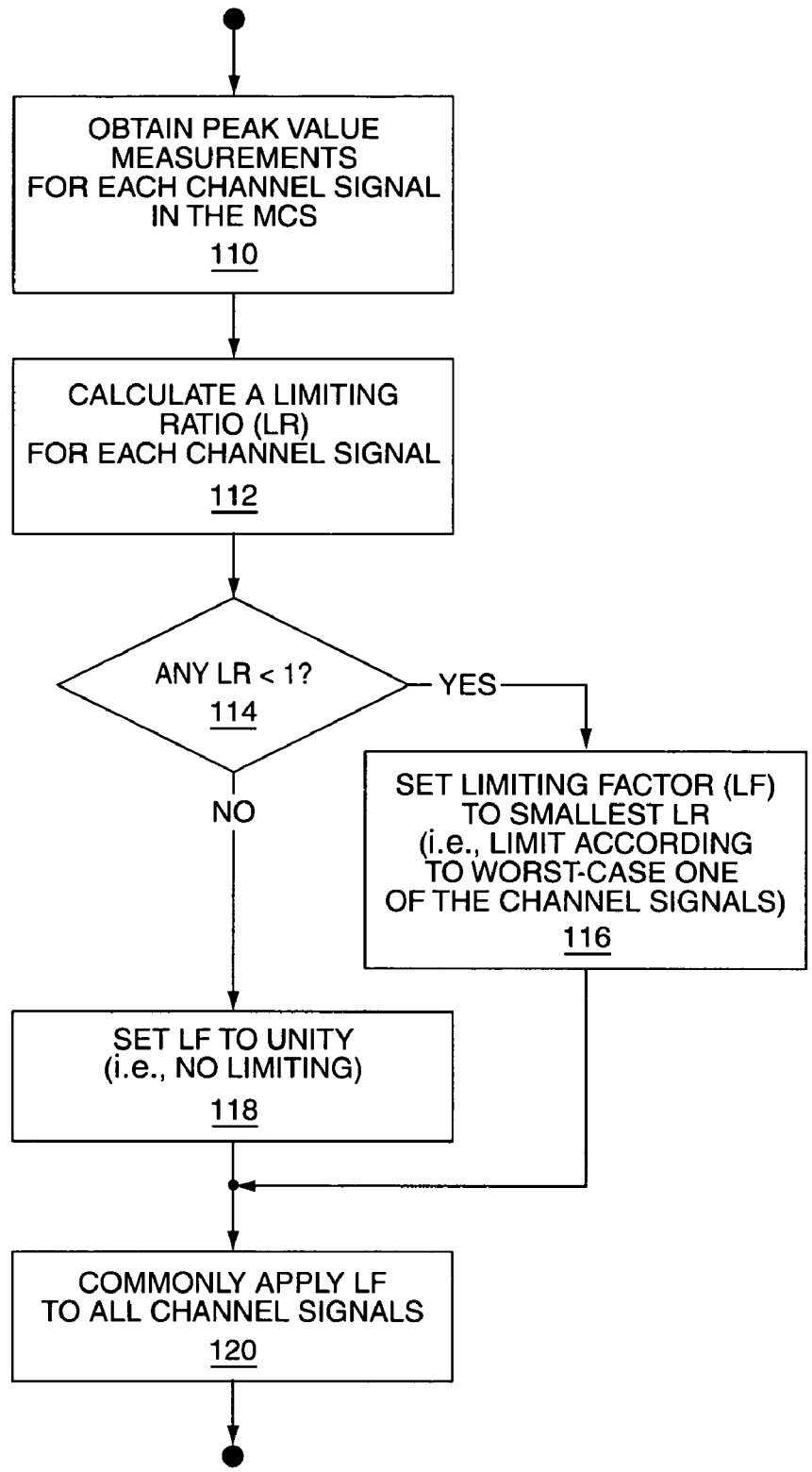
FIG. 3 is a logic flow diagram that provides additional processing logic details for one or more embodiments of limiting control.

FIG. 1 functionally illustrates one embodiment of a multichannel limiter 10 that provides limiting control for multichannel signals, such as a multichannel audio signal comprising left and right channel signals, for example. In particular, the limiter 10 is configured to set a "limiting factor" dynamically to whatever value is needed to prevent any channel signal included in the multichannel signal from exceeding defined magnitude limits and commonly applying that limiting factor to all channel signals. In other words, the limiter 10 coordinates the gain reduction of all channel signals making up the multichannel signal to prevent any channel signal from clipping, while simultaneously preserving the relative gain and amplitude relationships among the channel signals.

The limiter 10 performs multichannel signal limiting based on the application of a common limiting factor even where the limiter parameters, e.g., the maximum magnitude limit, the desired channel gain, and the current peak value, differ between two or more of the channel signals comprising the multichannel signal. As such, the limiter 10 can be applied advantageously in systems or devices wherein the channel signals have different magnitude limits, or different desired gains. By way of a non-limiting examples, a mobile communication device having differently sized left and right speakers, or having one speaker naturally closer to a user's ear than the other one, represent circumstances where one might expect the left and right channels of a stereo signal to have different maximum magnitude limits and/or different desired gain values.

With such signal limiting challenges in mind, the illustrated limiter 10 comprises a limiter control circuit 12 for generating actual gain values for each channel signal included in the multichannel signal based on the common limiting factor, and a gain control circuit 14 for applying the per-channel actual gain values to the channel signals. The limiter 10 further includes, or is at least associated with, a peak detection circuit 16 that provides peak detection for each channel signal comprising the multichannel signal, which also is referred to as the "MCS." The MCS generally includes at least two individual channel signals, and may include up to "N" individual channel signals, referred to as Ch1 . . . ChN. The limiter 10 further may be associated with one or more output circuits that are driven by the (soft) limited version of the multichannel signal provided by the limiter 10. In an audio signal context, such circuits may comprise digital-to-analog converters (D/As) 20, amplifier circuits 22, and speakers 24.

For example, in the illustrated context, the limiter 10 takes as its inputs the MCS and one or more limiter parameters, such as per-channel desired gain values, and per-channel maximum magnitude limits. The limiter 10 dynamically detects peak values on a per-channel basis, determines whether the detected peak value(s) on any channel signal will violate maximum magnitude limits given current desired gain settings and, if so, makes an appropriate adjustment to the actual gain values of all channels to prevent such violations. The limiter 10 thus provides a soft-limited version of the MCS to the D/As 20, which in turn provide the amplifier circuits 22 with corresponding analog signals that are then power-amplified and used to drive the loudspeakers 24.

In more detail, the multichannel signal (MCS) passes through the peak detection circuit 16, which provides per-channel peak detection values to the limiter control circuit 12 and a delayed version of the MCS to the gain control circuit 14. The delayed version of the MCS is denoted as MCS' in the illustration. Providing the gain control circuit 14 with the delayed version of the MCS effectively "advances" the peak detection function in time relative to gain control, allowing the limiter control circuit 12 to "see" peak values in the MCS before those peaks arrive at the input of the gain control circuit 14. In other words, by advancing peak detection, i.e., by providing the limiter control circuit 12 with "look-ahead" peak values, the limiter control circuit 12 can detect impending signal limit violations and adjust the per-channel actual gains applied by the gain control circuit 14 by updating the common limiting factor to prevent such violations from occurring.

In one embodiment, the "look-ahead" time for peak detection is set to a value at or about one-quarter cycle time of the lowest signal frequency of interest in the MCS. For example, if the MCS is a multichannel audio signal, the lowest frequency of interest might be 20 Hz. A 20 Hz signal has a cycle time of 50 ms, and one-quarter of that cycle time is 12.5 ms. Thus, the peak detection circuit 16 can be configured to delay the MCS' signal by about 12.5 ms. Of course, advances other than one-quarter cycle time can be used as needed or desired.

In any case, the limiter control circuit 12 receives look-ahead peak values for the MCS, and additionally receives one or more limiter parameters. In at least one embodiment, the limiter parameters comprise desired gain values for the MCS and magnitude limits for the MCS. Notably, the limiter 10 provides its multichannel-coordinated gain control even where different ones of the channel signals comprising the MCS have different limiter parameters. For example, the limiter control circuit 12 may receive a different desired gain value and/or different maximum magnitude limits for each channel signal. The different channel signals may have different limiter parameters because of differences in each channel's signal path, or because of differences in the output device or system driven by each channel signal.

By way of non-limiting examples, in the audio context, different audio channel signals may have different desired gain values and/or different magnitude limits because of non-centered balance control settings, because the different channel signals are used to drive different sizes of loudspeakers (after amplification), because of the need to tailor the generated sound field to a particular listener's position, or because the listener is presumed to be closer to one speaker than another. That last case may be a particular consideration in cellular telephones, or other types of communication handsets, portable music devices, etc., where the nature of the device generally requires the user to position one loudspeaker closer to his or her ear(s).

In any case, FIG. 2 broadly illustrates the coordinated, multichannel gain control of limiter 10 in one or more embodiments. Limiting control comprises dynamically calculating the limiting factor as the value needed to prevent a "worst-case" one of the channel signals in the MCS from exceeding its per-channel limits (Step 100). Processing continues with the limiter control circuit 12 updating the actual gain values for each channel signal by scaling the per-channel desired gain values by the limiting factor (Step 102). Note that the use of "per-channel" in this context denotes that each channel signal in the MCS may have different desired gain settings and/or different magnitude limits, but it should be understood that the same limiter parameters may be used for any number of channel signals in the MCS.

In at least one embodiment, the limiter 10 dynamically calculates the limiting factor (LF) as, $$LF = \min\left\{1, \frac{\text{Mag. Limit}(Ch1)}{\text{Des. Gain}(Ch1) \times \text{Peak Value}(Ch1)}, \dots, \frac{\text{Mag. Limit}(ChN)}{\text{Des. Gain}(ChN) \times \text{Peak Value}(ChN)}\right\}. \quad (1)$$

From Eq. 1, one sees that the limiter 10 maintains the limiting factor at whatever value is needed to prevent clipping, saturation, etc., on any of the channel signals within the MCS. More particularly, a "limiting ratio" (LR) is calculated for each channel signal in the MCS as the ratio of the channel signal's maximum magnitude value (limit) to the product of the channel signal's current peak value measurement and the channel signal's current desired gain value. Thus, Eq. 1 can be written as, $$LF = \min(1, LR(Ch1), LR(Ch2), \dots, LR(ChN)). \quad (2)$$

With the simplified notation of Eq. 2, one sees that the limiting factor is set to unity if none of the limiting ratios is less than unity, or is set to a lowest one of the limiting ratios is any of them is less than unity. Those skilled in the art will recognize that a limiting ratio of 1 represents a channel signal that is on the verge of exceeding its defined magnitude limits, i.e., the product of its desired gain and its current peak value exactly equals its maximum allowed magnitude.

FIG. 3 illustrates limiting control based on the implementation of Eq. 1 or 2. Processing begins with the limiter 10 obtaining look-ahead peak value measurements for each channel signal in the MCS (Step 110), and calculating a limiting ratio for each channel signal (Step 112), e.g., the limiting ratio for the ith channel signal=LR(Chi)=Mag. Limit (Chi)/(DG(Chi)×PV(Chi), where DG equals the desired gain setting and PV equals the current peak value.

Processing continues with the evaluation of the limiting ratios for all channel signals to determine whether any of them are less than unity (Step 114). If so, the limiting factor is set to the smallest one of the limiting ratios (Step 116), i.e., to the lowest fractional value, which corresponds to the worst-case one of the channel signals. If none of the limiting ratios is less than unity, then the limiting factor's value is set to unity (Step 118). In either case, the limiting factor is applied to all channel signals, such that any gain scaling needed to prevent clipping on any of the channel signals is commonly applied across all channel signals comprising the MCS.

Figure 4:
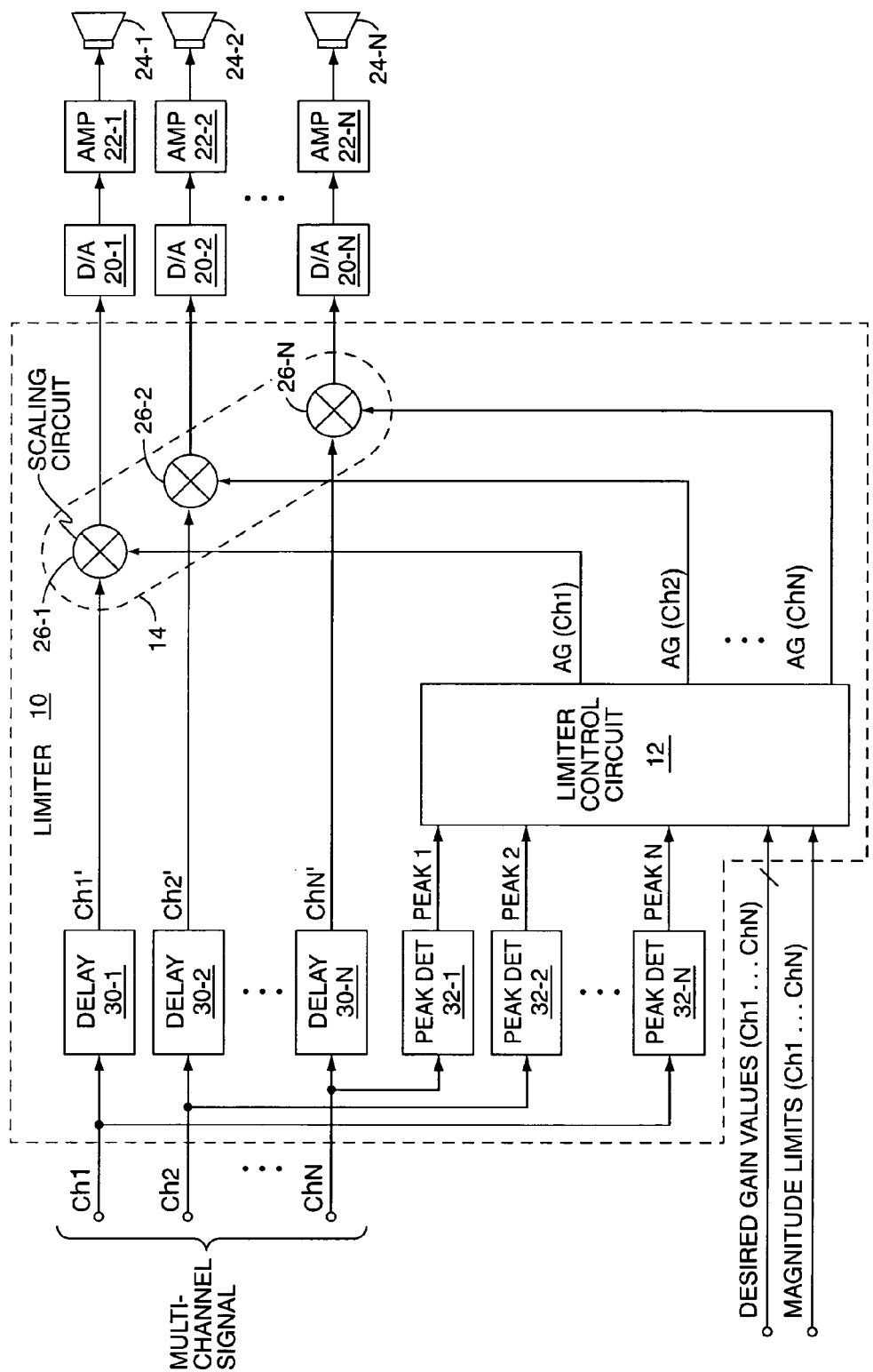
FIG. 4 is a block diagram of circuit details for one embodiment of the limiter of FIG. 1.

FIG. 4 illustrates the limiter 10 in more detail and, in particular, illustrates one method of commonly applying the limiting factor to all of the channel signals in the MCS. As illustrated, the gain control circuit 14 comprises a one or more scaling circuits 26, e.g., scaling circuit 26-1 for gain controlling Ch1 of MCS', scaling circuit 26-2 for scaling Ch2 of MCS', and so on. Thus, each channel signal is scaled by a corresponding actual gain value (AG) that is a product of that channel signal's desired gain value (DG) and the limiting factor (LF). Mathematically, the actual gain value applied to the ith channel signal=DG(Chi)×LF.

Also, the illustrated embodiment of the peak detection circuit 16 comprises delay circuits 30-1 through 30-N for delaying respective ones of the channel signals Ch1 through ChN, to produce the delayed signal, MCS', for input to the scaling circuits 26 of gain control circuit 14. Peak detection circuit 16 further includes peak detectors 32-1 through 32-N to generate peak value measurements for channel signals Ch1 through ChN.

Figure 5:
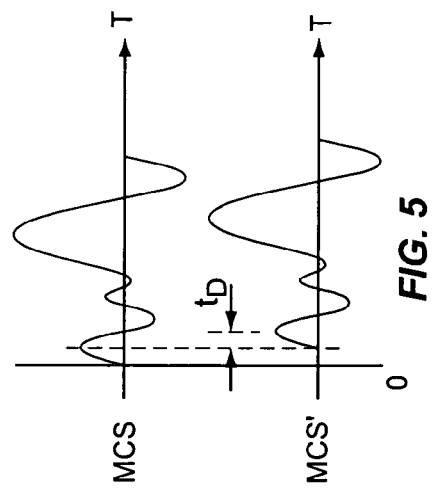
FIG. 5 is a waveform diagram illustrating the use of a time delay for look-ahead peak detection.

As explained earlier, delaying the MCS signal operated on by the gain control circuit 14 effectively advances in time the peak detection values provided to the limiter control circuit 12, so that limiting control can be imposed proactively, in response to detecting an impending channel limit violation that otherwise would arise by applying a given channel signal's current actual gain setting to a particular peak value in that signal. One may refer to FIG. 5, which illustrates the time delay, $t_D$, imposed on MCS' relative to MCS, which allows peak detection to operate on MCS in advance of gain control being imposed on MCS'.

Figure 6:
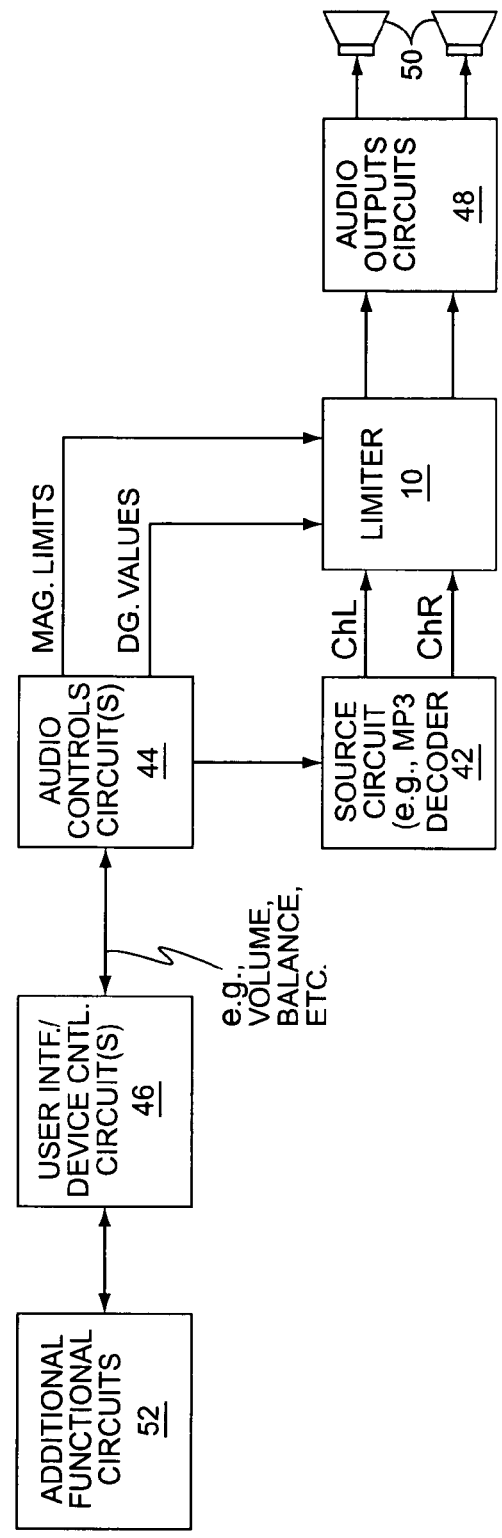
FIG. 6 is a block diagram of an electronic device that incorporates an embodiment of the limiter of the FIG. 1.

FIG. 6 places the limiter 10 in the context of an electronic device 40 that is configured for local or remote playback of a multichannel audio signal. The device 40 comprises, in addition to an embodiment of limiter 10, an audio source circuit 42, an audio control circuit 44, user interface/control circuits 46, audio output circuits 48 and associated loudspeakers 50, and, optionally, one or more additional "functional" circuits 52.

If included, the nature and extent of these additional circuits 52 will vary with the intended functionality of the device

40. For example, if the device 40 comprises a mobile station, e.g., a cellular telephone, the additional functional circuits 52 generally will include wireless transceiver circuits for receiving and transmitting wireless communication signals, and one or more baseband processing circuits for processing such signals. Alternatively, if the device 40 comprises a Portable Digital Assistant (PDA), the additional circuits 52 may comprise processing circuits and interface controls for data input/output, contact list management, etc. Of course, none of these examples are limiting, and the particular configuration of device 40 is not germane to the limiting control discussed herein.

With such flexibility in mind, in operation, the source circuit 42 provides the limiter 10 with a multichannel audio signal, e.g., left and right channel signals (ChL and ChR) comprising a stereo signal. The source circuit 42 may comprise a decoder circuit configured to decode digital music files. Thus, the source circuit 42 may be an MP3 decoder, a WMA decoder, an ATRAC decoder, an MC decoder, or a multiformat decoder that is configured to decode stored digital audio files according to one or more industry-standard and/or proprietary file formats.

The audio control circuits 44 may start and stop source file streaming from the source circuit 42 to the limiter 10, and may allow a user to select particular source files for playback. Additionally, the audio control circuits 44, which may comprise software, hardware, or any combination thereof, may be configured to provide the limiter 10 with the limiter parameters needed to calculate the limiting factor used to prevent clipping of the stereo signal. Thus, the audio control circuit 44 may provide the limiter 10 with desired gain values determined from user-adjusted playback volume settings, stereo balance settings, etc., which may be set through the interface/control circuits 46 as needed.

Additionally, one or more of the limiter parameters, such as the per-channel maximum allowed magnitude may be included as configured values in the device 40, i.e., device 40 may include one or more memory circuits storing default limiting parameter values. Those default values can be fixed at design-time, or based on calibration values, and typically reflect the particular limitations and characteristics of the circuits and speakers used for the different audio channels. For example, device 40 may use different sizes of loudspeakers for the different channels, and the magnitude limit settings for each channel signal can reflect the limitations (or capabilities) of the loudspeaker driven by that channel signal.

For digital domain implementations of limiter 10, the magnitude limit for each channel can be expressed as a maximum count value, e.g., a not-to-exceed count value corresponding to the input count range of the D/As being used to generate analog signals from the soft-limited channel signals. Similarly, the desired and actual gain values can be integer or real-valued numbers used to scale the digital values comprising the channel signals of the MCS.

With a full-digital implementation, the limiter 10 may comprise hardware, software, or any combination thereof. For example, the limiter 10 may be implemented in stored program instructions for execution by a microprocessor, DSP, or the like, and it may be integrated with other processing functionality. For example, the limiter 10 may be functionally implemented in a microprocessor or other processing circuit that performs one or more additional functions related to the operation of the device 40. Of course, the limiter 10 is not limited to digital domain processing, and it should be understood that the limiter 10 can be implemented in whole or in part in the analog domain.

Also, regardless of whether the limiter 10 is configured for digital, analog, or mixed digital/analog processing, it should be understood that the processing methods illustrated in FIGS. 2 and 3, for example, generally represent a dynamic process that updates the limiting factor on an ongoing basis and/or as needed. For example, the peak detection circuit 16 may update its peak value measurements on a periodic basis, and the limiter 10 can recalculate the limiting factor at least as often as new peak value measurements are provided to it. Further, the limiter 10 may make as-needed recalculations of the limiting factor responsive to changes in the limiter parameters. For example, the desired gain settings of one or more of the channel signals may change from time to time, such as in audio playback applications where a user may adjust volume and/or balance settings, and the limiter 10 can recalculate the limit factor responsive to such changes. Also, it should be understood that the maximum magnitude limits may be set explicitly for any one or more of the channel signals comprising the multichannel signal, or may be implicit limits, such as full-scale analog and/or digital range limitations, which can be different for individual ones of the channel signals.

Broadly, then, the limiter 10 enables a method of limiting a multichannel signal based on calculating a gain scaling value—i.e., the limiting factor—needed to prevent the worst-case one of the channel signals comprising the multichannel signal from exceeding the limits defined for that channel. Those limits may be unique to that channel, or may be used for one or more other channels in the multichannel signal. In either case, the limiter 10 commonly applies the limiting factor to all channels, so that gain control is coordinated across the channels, and the relative gain and amplitude relationships among the channels are preserved. As such, the present invention is not limited by the foregoing discussion, nor is it limited by the accompanying figures. Rather, the present invention is limited only by the following claims and their reasonable, legal equivalents.

What is claimed is:

1. A method of limiting control for a multichannel signal including two or more channel signals, the method comprising:
   dynamically calculating a limiting factor as the value needed to prevent a worst-case one of the channel signals from exceeding per-channel limits, wherein the per-channel limits differ between at least two of the channels in the multichannel signal; and
   commonly applying the limiting factor to all of the channel signals by scaling a desired gain value for each channel signal by the limiting factor.

2. The method of claim 1, wherein the per-channel limits differ between at least two of the channel signals in the multichannel signal in at least one of the following parameters: a maximum magnitude limit, a peak limit, and a desired gain.

3. The method of claim 1, wherein the desired gain values differ between at least two of the channel signals in the multichannel signal.

4. The method of claim 1, wherein scaling a desired gain value for each channel signal by the limiting factor comprises, for each channel signal, soft-limiting each channel signal by multiplying the channel signal's desired gain value by the limiting factor.

5. The method of claim 1, wherein dynamically calculating a limiting factor as the value needed to prevent a worst-case one of the channel signals from exceeding per-channel limits comprises:
   calculating a limiting ratio for each channel signal as the ratio of a maximum magnitude value defined for the channel signal to the product of a current peak value detected for the channel signal and a current desired gain value of the channel signal; and setting the limiting factor to unity if none of the limiting ratios is less than unity, and setting the limiting factor to a smallest one of the limiting ratios if any of the limiting factors are less than unity.

6. The method of claim 1, further comprising defining different maximum allowed magnitudes as the per-channel limits for two or more of the channel signals.

7. The method of claim 1, further comprising setting different desired gains for two or more of the channel signals.

8. The method of claim 1, wherein the multichannel signal comprises a multichannel audio signal.

9. A limiter for limiting a multichannel signal that includes two or more channel signals, the limiter comprising one or more processing circuits configured to:

dynamically calculate a limiting factor as the value needed to prevent a worst-case one of the channel signals from exceeding per-channel limits, wherein the per-channel limits differ between at least two of the channels in the multichannel signal; and commonly apply the limiting factor to all of the channel signals by scaling a desired gain value for each channel signal by the limiting factor.

10. The limiter of claim 9, wherein the one or more processing circuits comprise a limiter control circuit configured to calculate the limiting factor by evaluating limiter parameters for each channel signal, and a scaling circuit for each channel signal, each scaling circuit configured to scale a corresponding one of the channel signals by scaling the desired gain value for the channel signal by the limiting factor, and applying the scaled desired gain value to the channel signal.

11. The limiter of claim 9, wherein the one or more processing circuits comprise a limiter control circuit configured to calculate the limiting factor, and a scaling circuit for each channel signal configured to scale the channel signal by the limiting factor, said limiter control circuit configured to receive limiter parameters for each channel signal, calculate a limiting ratio for each channel signal based on the corresponding limiter parameters, and set the limiting factor to a smallest one of the limiting ratios that is less than unity or set the limiting factor to unity if none of the limiting ratios is less than unity.

12. The limiter of claim 11, wherein the limiter control circuit is configured to receive a peak value, a maximum magnitude value, and a desired gain value as the limiter parameters for each channel signal, wherein at least one such limiter parameter differs between two or more channels of the multichannel signal, and to calculate the limiting ratio for each channel signal as the ratio of the maximum magnitude value to the product of the peak value and the desired gain value, such that the limiting ratio for a given channel is less than unity if the product of the peak value and the desired gain value for the given channel signal exceeds the maximum magnitude value defined for the given channel.

13. The limiter of claim 12, wherein the limiter is configured to delay the channel signals before scaling via the corresponding scaling circuits by a desired amount relative to peak detection, such that the peak values provided to the limiter control circuit for the channel signals are advanced in time relative to the channel signals.

14. The limiter of claim 13, wherein the limiter control circuit is configured to advance the peak values for the channel signals by about one-quarter cycle time of a lowest multichannel signal frequency of interest.

15. The limiter of claim 9, wherein the limiter is configured to scale the desired gain value for each channel signal by the limiting factor by, for each channel signal, soft-limiting each channel signal based on multiplying the channel signal's desired gain value by the limiting factor.

16. The limiter of claim 9, wherein the limiter is configured to dynamically calculate the limiting factor by calculating a limiting ratio for each channel signal as the ratio of a maximum magnitude value defined as the per-channel limit for the channel signal to the product of a current peak value detected for the channel signal and a current desired gain value of the channel signal, setting the limiting factor to unity if none of the limiting ratios is less than unity, and setting the limiting factor to a smallest one of the limiting ratios if any of the limiting factors are less than unity.

17. The limiter of claim 9, wherein the multichannel signal comprises a multichannel audio signal.

18. A mobile station including the limiter of claim 9, wherein the mobile station includes two audio speakers for audio output of the multichannel signal, and wherein the two audio speakers have sizes or placements within the mobile station that impose differing magnitude limits on the corresponding channels of the multichannel signal.

19. A method of limiting a multichannel signal that includes two or more channel signals, the method comprising:

dynamically setting a limiting factor to a value needed to prevent any channel signal from exceeding a maximum magnitude limit defined for the channel signal, wherein the maximum magnitude limit differs between at least two of the channels in the multichannel signal; and commonly applying the limiting factor to all channel signals by scaling a desired gain value for each channel signal by the limiting factor.

20. The method of claim 19, wherein the maximum magnitude limit defined for each channel and a desired gain value set for each channel comprise per-channel limiter parameters, and wherein one or more of the per-channel limiter parameters differ between at least two of the channel signals.

21. The method of claim 19, wherein dynamically setting a limiting factor to a value needed to prevent any channel signal from exceeding a maximum magnitude limit defined for the channel signal comprises calculating a limiting ratio for each channel signal by dividing the maximum magnitude limit defined for the channel signal by the product of a peak signal value detected for the channel signal and a desired gain value set for the channel signal, and setting the limiting factor to the smallest one of the limiting ratios that is less than unity.

22. The method of claim 19, wherein commonly applying the limiting factor to all channel signals comprises setting an actual gain value for each channel signal by scaling a desired gain value associated with the channel signal by the limiting factor.

23. The method of claim 19, wherein dynamically setting a limiting factor to a value needed to prevent any channel signal from exceeding a maximum magnitude limit defined for the channel signal comprises, for each channel signal, forming a product of a currently measured peak value of the channel signal and a desired gain value for the channel signal, dividing the maximum magnitude limit of the channel signal by the product to obtain a ratio, and setting the limiting factor to a lowest one of the ratios if any of said ratios is less than unity, or setting the limiting factor to unity none of the ratios is less than unity.

24. The method of claim 19, wherein the multichannel signal comprises a multichannel audio signal.

* * * * *